United States Patent [19]
Yanagimoto

[11] Patent Number: 5,369,795
[45] Date of Patent: Nov. 29, 1994

[54] HIGH FREQUENCY TRANSFORMER AND MIXER USING THE SAME

[75] Inventor: Yoshiyuki Yanagimoto, Kobeshi, Japan

[73] Assignee: Hewlett-Packard Company, Palo Alto, Calif.

[21] Appl. No.: 890,626

[22] Filed: May 28, 1992

[30] Foreign Application Priority Data

May 29, 1991 [JP] Japan .................. 3-153904

[51] Int. Cl.$^5$ .............................. H04B 1/26
[52] U.S. Cl. ...................... 455/327; 333/26; 455/330
[58] Field of Search ............... 455/325, 326, 327, 330, 455/318, 319; 333/26, 33, 125, 127, 128, 136

[56] References Cited

U.S. PATENT DOCUMENTS

| | | | |
|---|---|---|---|
| 3,772,599 | 11/1973 | Ernst et al. | 455/325 |
| 4,330,868 | 5/1982 | Hallford | 333/26 |
| 4,739,289 | 4/1988 | Cripps | 333/26 |

FOREIGN PATENT DOCUMENTS 2104750 3/1983 United Kingdom ............ 455/327

OTHER PUBLICATIONS

Bert Henderson, "Mixers in Microwave Systems", MSN (Microwave Systems News), Oct. 1989, pp. 64-65, 68-69 and 72-74.
Bert Henderson, "Mixers in Microwave Systems–Part II", MSN (Microwave Systems News), Nov. 1989, pp. 71-75.

*Primary Examiner*—Edward F. Urban
*Assistant Examiner*—Mark D. Wisler

[57] ABSTRACT

The present invention provides a high frequency transformer capable of stable operation from DC to high frequency. Additionally the present invention provides a mixer with low insertion loss and low distortion, in which a common mode choke is removable from an input portion thereof. To form the stable high frequency transformer according to the present invention, a short circuiting pattern couples two strip lines together to form a U-shaped pattern on a printed circuit board and a lead wire is insulatedly coupled to each strip line and short-circuited at the tip of the U-shape. According to the present invention, a local oscillator is connected to a first port of the high frequency transformer, a diode switch is connected to a second port of the high frequency transformer, thereby serving as an IF output terminal, and a third port is formed at the short-circuiting pattern, thereby serving as the RF input terminal. Each of the strip lines is designed so as to have a characteristic impedance twice as large as the characteristic impedance of the RF input system providing the RF input. Matching the characteristic impedance of the strip lines and the characteristic impedance of the RF input system is achieved even when a common mode choke is coupled to the local oscillator. In this way, the inductance of the common mode choke viewed from the RF input terminal can be neglected, so that a mixer with low insertion loss and low distortion is operable over a broad range of frequencies.

13 Claims, 6 Drawing Sheets

HIGH FREQUENCY TRANSFORMER AND MIXER USING THE SAME

FIELD OF THE INVENTION

The present invention relates to a high frequency transformer and a mixer using the transformer, for providing stable operation in the range from direct current (DC) to high frequency. More particularly, the present invention can be operated without a common mode choke in its input portion, and can alleviate an increase in the input impedance due to the inductance of a common mode choke in a RF port if a common mode choke is used.

BACKGROUND OF THE INVENTION

Among balanced high frequency mixers, there are single balanced mixers (SBM) and double balanced mixers (DBM). These mixers are constructed so as to include diodes, transformers and the like.

To decrease the size of the mixers, a microstrip line formed on a printed circuit board can be used. A coaxial cable without its outer insulation sheath is soldered onto the microstrip line and serves as the transformer.

For example, in the SBM as shown in FIG. 1(A) two strip lines 21a and 21b (first and second strip lines) are formed along a straight line on a printed circuit board in such a manner that a non-pattern forming portion is interposed between both ends of the strip lines 21a and 21b which are confronted to each other, and a third strip line 22 is also formed on the printed circuit board in such a manner as to project from the non-pattern forming portion perpendicularly to the first and second strip lines 21a and 21b. With this arrangement, the strip lines are formed in a T-shaped structure as a whole as shown in FIG. 1(A).

The end portion of the strip line 22 at the joint portion of the "T-shape" is branched into two branches 23a and 23b (a balun is formed with inductances of the two branches). The tip portions of the branches 23a and 23b are coupled to the end portions of the strip lines 21a and 21b respectively at the inner side of the "T-shape". In addition, the strip lines 21a and 21b are designed so as to have a length equal to a quarter of the wavelength of a specific frequency typically the RF (radio frequency) input frequency. The characteristic impedances of the strip lines 21a, 21b and 22 are matched with the characteristic impedance of an IF (intermediate frequency) output side (usually 50 Ohms).

Further, a series circuit comprising two diodes $D_{21}$ and $D_{22}$ is connected between the end portions of the strip lines 21a and 21b which are located at the center (junction of three line portions) of the "T-shaped structure", and a RF input terminal 24 is drawn out from a connecting point of the two diodes $D_{21}$ and $D_{22}$. In addition, a coaxial cable 25 whose length is the same length as strip line 21a and which has a non-insulating outer sheath therearound is soldered onto strip line 21a. One end of a center conductor of the coaxial cable 25 which is located at the inner end portion of the "T-shaped structure" and is connected with one end of the strip line 21b also located at the inner end portion of the "T-shaped structure," while the other end of the center conductor of the coaxial cable 25 at the outer end portion of the "T-shaped structure" is connected to one terminal of a local oscillator 26. Further, the other end of the local oscillator 26 and the other ends of the strip lines 21a and 21b at the outer end portions of the "T-shaped structure" are connected to the ground of the back side of the printed circuit board through holes (not shown in figures).

FIG. 1(B) shows an equivalent circuit of the mixer in FIG. 1(A). $L_A$ represents the inductance produced by the coaxial cable 25 on the strip line 21a as shown in FIG. 1(A), while $L_B$ represents the inductance produced by the balun formed of 23a and 23b (acting as a common mode choke).

According to this kind of SBM, when a RF signal of DC to 1.5 GHz is converted to an IF signal of 2 GHz, the local signal of the local oscillator 26 is set to 2 to 3.5 GHz. The local signal serves to perform a switching operation of the set of diodes $D_{21}$ and $D_{22}$, and through the switching operation the local signal and the RF input signal are mixed with each other. The mixed signal is passed through a common mode impedance formed of the branches 23a and 23b and provided as an output through the terminal 22 as an IF signal. The microstrip line 21b to which the coaxial cable 25 is not coupled is used as a dummy element balancing the microstrip line 21a.

In the SBM as described above, the input impedance can be reduced. However, by reducing the input impedance, the isolation between the RF port and the local oscillator port will become insufficient since the RF port and the local oscillator port are connected through the diodes $D_{21}$ and $D_{22}$, thereby increasing the insertion loss. An additional disadvantage is that leakage of the RF signal and the local oscillation signal will become larger than those in a DBM as described below.

FIG. 2(A) is an equivalent circuit diagram of a DBM. In FIG. 2(A), a pattern and the like on a printed circuit board are omitted. Transformers 31 and 32 (inductances $L_1$, $L_2$,) and a common mode choke 33 (inductance $L_3$) are formed from microstrip lines on the printed circuit board.

In FIG. 2(A), in response to a local signal supplied from a local oscillator 34 through a common mode choke 33 diodes $D_1$ and $D_2$ or $D_3$, and $D_4$ of a diode set 35 are switched, so that an RF signal supplied from a terminal 37 is mixed with the local signal. The mixed signal is passed through a balanced-to-unbalanced transformer 36 and output as an IF signal from a terminal 38.

For example, when an input RF signal of DC to 1.5 GHz is to be converted to an IF signal of 2 GHz, the output of the local oscillator 34 is set to 2 to 3.5 GHz, and the local oscillation signal is used to switch the diodes set 35 through the inductances $L_1$, $L_2$ and $L_3$. In addition, two balanced signals (mixed signals) are output from the diode set 35 and then converted through the balanced-to-unbalanced transformer 36 to provide the IF output signal.

However, viewing the diodes from the RF input side, the inductance $L_3$ of the common mode choke 33 is directly viewed through the transformers 31 and 32. Therefore, as the input impedance of the RF terminal 37 becomes larger, the insertion loss and distortion are increased, so that the input return loss deteriorates.

In a case where the common mode choke 33 is not provided, as is shown in FIG. 2(B), a source resistance 39 of the local oscillator 34 has a larger influence, and thus a path of the inductances $L_2$ and $L_3$ of the transformers 31 and 32 becomes unbalanced, so that the IF output is not stabilized. For this reason, the common mode choke 33 is indispensable for a conventional mixer to provide a balanced path.

SUMMARY OF THE INVENTION

The present invention overcomes the above disadvantages of the prior art by
 (1) providing a stable high frequency transformer which can be operated in the range from high frequency, and
 (2) providing a wide-band mixer having both low insertion loss and low distortion in which a common mode choke can be removed from the input portion. Even when a common mode choke is provided, the transformer and mixer of the present invention eliminate the increase of the input impedance at the RF terminal due to the inductance of the common mode choke.

According to one aspect of this invention, a high frequency transformer has a substantially U-shaped pattern which comprises two strip lines and a short-circuiting pattern for connecting the two strip lines to each other at one end thereof. The lead wires have substantially the same length as the strip lines and are insulatedly formed on both of the strip lines respectively in such manner that both ends of the lead wires located on the tip portions of the U-shaped pattern are short-circuited to each other, and the other ends of the lead wires located at the base of the U-shaped pattern serve as a first port while both ends of the strip lines located at the tip portions of the U-shaped pattern serve as a second port.

Further, according to another aspect of this invention, a DBM comprises a local oscillator connected in between both ends of the first port, a diode switch serving as an IF output terminal and comprising two pairs of diode circuits which are connected in an opposite polarity between both ends of the second port, each diode circuit including two diodes serially connected to each other with forward polarity, and a third port serving as an RF input terminal which is provided to the short-circuiting pattern for the two strip lines of the U-shaped pattern, thereby making the characteristic impedance of each strip line twice as large as the characteristic impedance of the RF input system.

The two strip lines constituting the substantially U-shaped pattern are not necessarily arranged in parallel in the high frequency transformer according to the present invention. However, for convenience of a pattern design, these strip lines are preferably arranged in parallel.

Further, any kind of lead wire may be used as lead wires insofar as they are electrically insulated from the strip lines, and thus various types of cords may also be used. However, in a coaxial cable having no insulating outer casing (a fully-exposed outer conductor) is preferably used. Such coaxial cables can be easily joined to the strip lines by soldering.

In the above high frequency transformer, the first and second ports can be used as an input or output port, respectively, and vice versa. A terminal corresponding to a center tap of the transformer can be drawn out as a third port from the short circuiting pattern of the U-shaped pattern or from a short-circuiting portion for the lead wires which is formed at the tip portions of the U-shaped pattern. Like the first and second port, the third port can also be used as either an input or output port.

In addition, the strip lines can be so formed so that their characteristic impedances match the characteristic impedance of the input-output system. In this case, upon viewing the transformer from the second port and the third port, the two strip lines are connected together in parallel, so that the characteristic impedance of the strip lines is twice as large as that of the input-output system.

The short-circuiting pattern portion can be formed as a capacitor. In a case where the third port is formed at the short-circuiting pattern portion, when a filter comprising inductor and capacitor patterned on the printed circuit board is connected to the third port, the capacitor pattern formed at the short-circuiting pattern portion can be used as a final capacitor of the filter.

The length of the strip line is properly determined in accordance with the frequency of a signal to be processed. For example, the length may be about a quarter of the wavelength of the highest frequency of the signals to be processed. Nevertheless, if the strip line is too long, the coupling of the transformer is better in a low frequency range. However, since resonance often happens in a high frequency range. The length of the strip line is generally set to a longer value within a permitted range where no resonance occurs even by the highest frequency signal.

The mixer according to the present invention provides a local oscillator connected to the first port, and the diode set as described above (two pairs of diode circuits each comprising two diodes serially connected to each other are connected in forward polarity between both terminals of the second port, and a joined point for each diode pair is used as an IF output terminal) is connected to a post-stage of the second port. The third port is used as a RF input terminal.

As described above, by properly designing the width of the strip lines and so on, the characteristic impedance of the two strip lines constituting the U-shaped pattern can usually be matched with the characteristic impedance of the system.

In the DBM as described above, a common mode choke is usually provided between a source and a transformer. According to this invention, the common mode choke may comprise a coaxial cable, or may be patterned on the printed circuit board.

The high frequency transformer of the present invention may also provide a balanced-to-unbalanced transformer installed at the output of the diode set. In this case, a second high frequency transformer according to the present invention may be coupled to the diode set so that the lead wires of the transformer at the tip portions are connected to the output of the diode set. The opposite ends of the lead wires, (i.e., at the base of the U-shape) provide the IF output port for the mixer. Alternatively, an attenuator could be used at the output of the diode set instead of a second transformer to provide a balanced-to-unbalanced conversion.

The two center conductors of the coaxial cables joined onto the strip lines are designed so as to be short-circuited at the tip portions of the U-shaped pattern so that a primary side viewed from the local oscillator is not required to be grounded in the transformer of this invention (as show in FIG. 2(A)). Therefore, even if a common mode choke is provided at the local oscillator side, the inductance of the choke viewed from the RF port is negligible. Therefore, the mixer according to the present invention has low insertion loss and low distortion and provides stable operation over a wider frequency band.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION

Figure 1A:
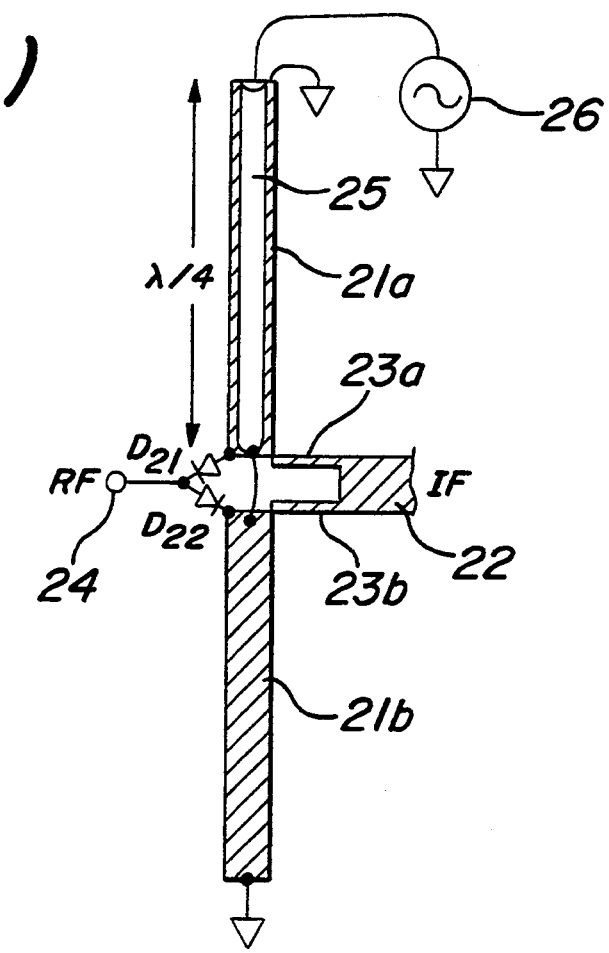
FIG. 1(A) is a circuit diagram of a conventional SBM.
Figure 1B:
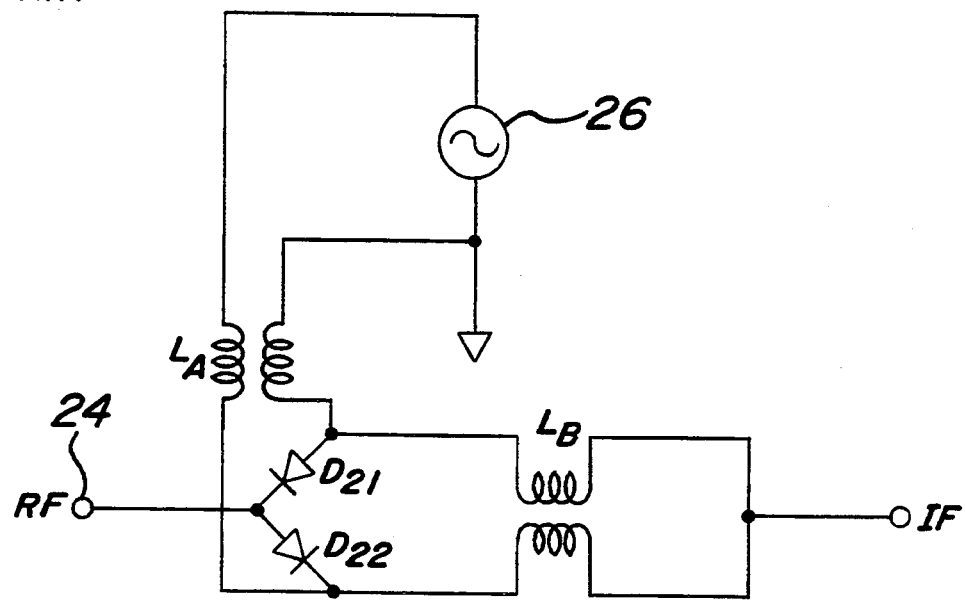
FIG. 1(B) is an equivalent circuit diagram of the SBM shown in FIG. (1A).
Figure 2A:
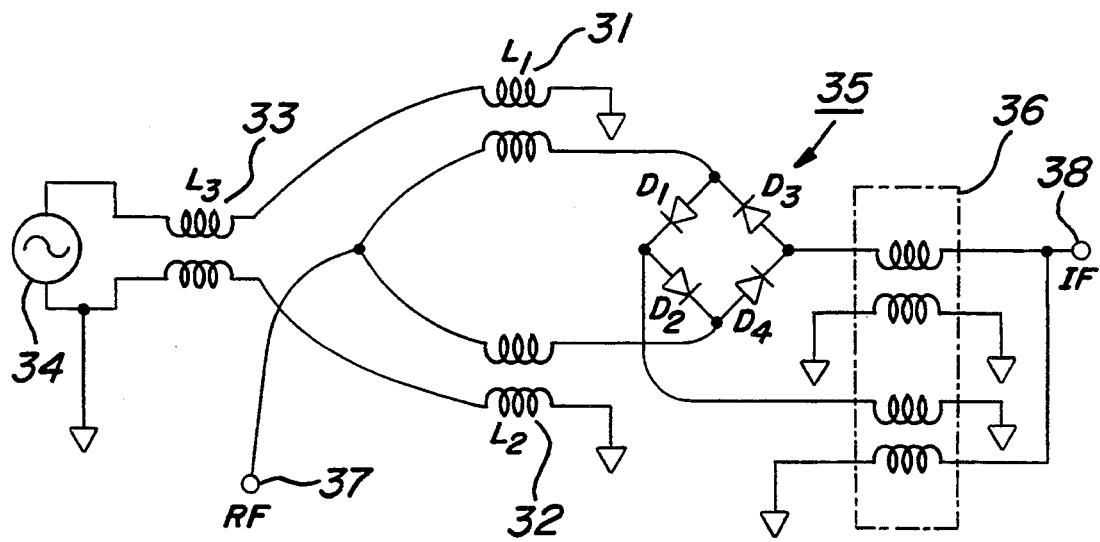
FIG. 2(A) is a circuit diagram of a conventional DBM.
Figure 2B:
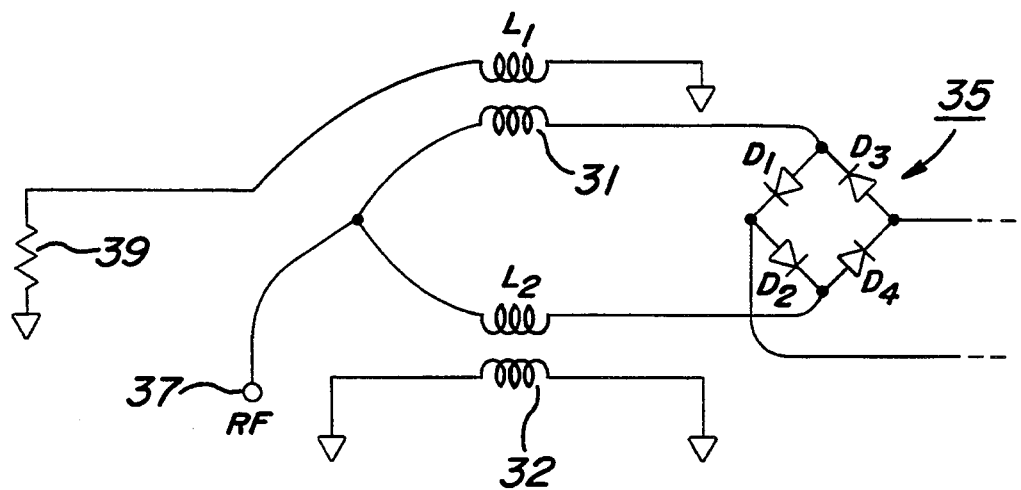
FIG. 2(B) is an equivalent circuit diagram of the DBM shown in FIG. 2(A).
Figure 3A:
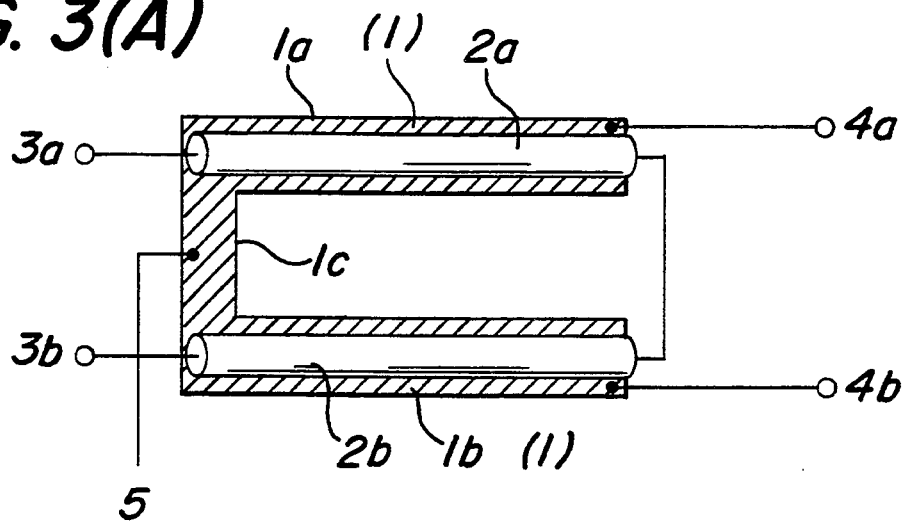
FIG. 3(A) shows one embodiment according to the present invention.

FIG. 3(A) shows a printed circuit board pattern of a high frequency transformer according to the present invention. A U-shaped pattern 1 is formed on a printed board (indicated by oblique lines in FIG. 3(A)), and two strip lines 1a and 1b (placed parallel to each other in FIG. 3(A)) of the U-shaped pattern are short-circuited by a short-circuiting pattern 1c thereby forming the "U-shape".

In addition, coaxial cables 2a and 2b each having substantially the same length as the strip lines are joined onto the strip lines 1a and 1b, respectively. The coaxial cables 2a and 2b have no insulating outer sheaths, and outer conductors thereof are directly soldered onto the strip lines 1a and 1b. In this embodiment, the center conductors of the coaxial cables 2a and 2b are used as the lead wires provided on the strip lines 1a and 1b, and the center conductors are insulated from the outer conductors through insulators provided therebetween.

The center conductors of the coaxial cables 2a and 2b are short-circuited at the ends located at the opposite side to the short-circuiting pattern 1c (at the tip portions of the U-shaped pattern), and a pair of terminals 3a and 3b are drawn out as a first port from the other ends of the center conductors which are located at the base side of the U-shaped pattern. In addition, two terminals 4a and 4b which serve as a second port are individually drawn out from both ends of the U-shaped pattern of the strip lines 1a and 1b, and a terminal 5 (a third port) is drawn out from the short-circuiting patterns 1c of the U-shaped pattern 1.

If the length of the strip lines 2a and 2b is too short, the coupling of the transformer will be insufficient. On the other hand, if the length is too long, the coupling can be ensured in a low frequency range, but resonance will occur in a high frequency range. Therefore, the length of the strip lines 1a and 1b is set to be longer within a permitted range where no resonance occurs even at the highest frequency of the frequency range to be processed by the transformer. Usually, the length of the strip lines 1a and 1b is specified to be a quarter of the wavelength of the highest frequency.

In order to match the characteristic impedance of the input system, the characteristic impedance of the strip lines 1a and 1b can be adjusted to be twice a particular impedance; for example, the characteristic impedance of the third port by appropriately setting the width, thickness, and length of the strip lines 1a and 1b.

In the above transformer, any of the first to third ports may be used as an input port or an output port. However, when the transformer is used in a DBM, the first to third ports are used as a local-oscillator input port, an IF output port and an RF input port, respectively.

Figure 3B:
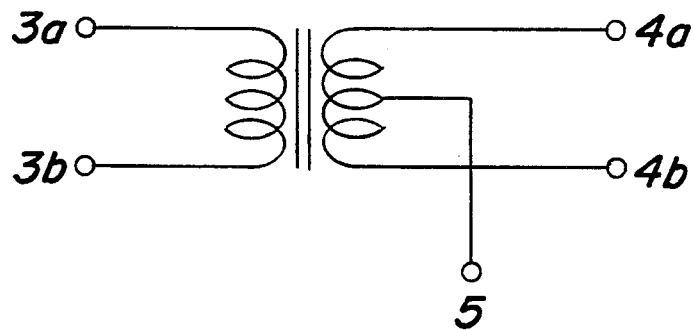
FIG. 3(B) shows an equivalent circuit of the embodiment shown in FIG. 3(A).

FIG. 3(B) is an equivalent circuit diagram of the high frequency transformer shown in FIG. 3(A).

Figure 4:
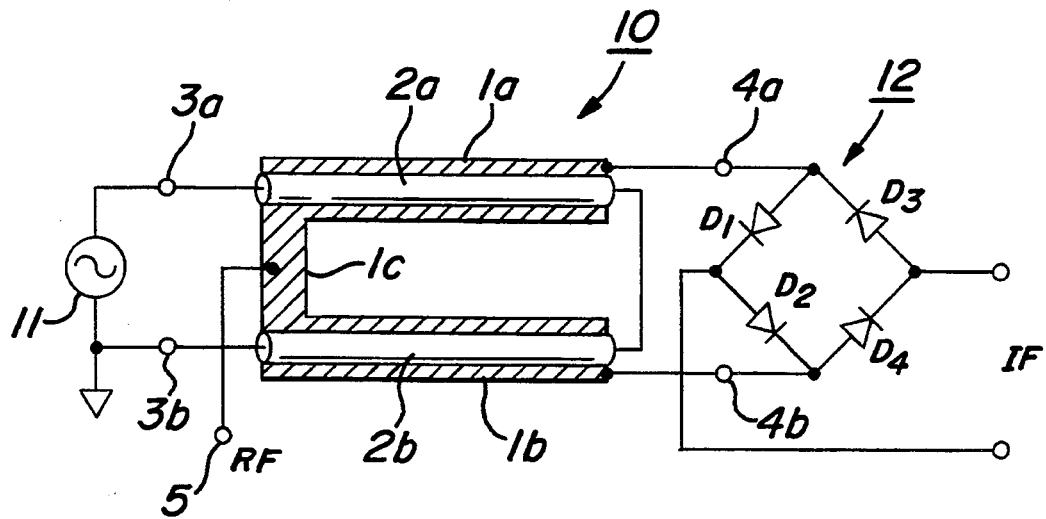
FIG. 4 shows a general configuration of a mixer according to the present invention.

FIG. 4 is a diagram showing the basic circuit construction of a DBM which is designed using the high frequency transformer 10 as shown in FIG. 3(A). A local oscillator 11 is connected to the first port (the terminals 3a and 3b), and a diode set 12 serving as a switch is connected to the second port (the terminals 4a and 4b). The diode set 12 comprises two pairs of diode circuits each including two diodes which are connected in series with the same polarity, each of the pairs ($D_1$, $D_2$ and $D_3$, $D_4$) being connected in parallel in a reverse polarity between both terminals of the second port of the transformer 10. The IF output port is drawn out from the connecting point of the two diodes $D_1$ and $D_2$ ($D_3$ and $D_4$) of each pair, while the third port (the terminal 5) is used as the RF input port.

Referring to FIG. 4, since the strip lines 1a and 1b can be regarded as a parallel circuit upon viewing the strip lines 1a and 1b from the RF input terminal, for a 50 Ohms characteristic impedance of the RF input system, the characteristic impedances of the strip lines 1a and 1b is 100 Ohms, respectively.

Figure 5:
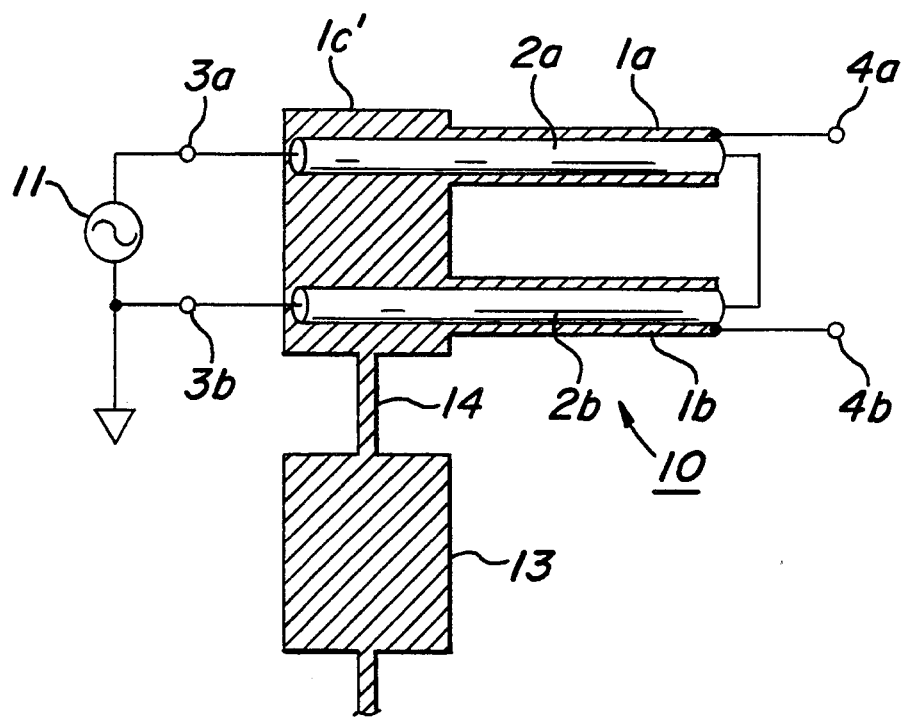
FIG. 5 shows an embodiment in which a patterned filter circuit is connected to the RF terminal of the mixer according to the present invention.

FIG. 5 shows a construction in which a low-pass filter circuit is patterned at the RF input side of the high frequency transformer 10, and a capacitor 13 and an inductor 14 are formed on the printed circuit board. Usually, the low-pass filter is provided by forming the capacitor and the inductor on the printed circuit board. However, according to this invention, when a filter capacitor 1c' is formed from the short-circuiting pattern 1c, a better matched filter circuit can be provided on only one side of the printed circuit board.

Figure 6:
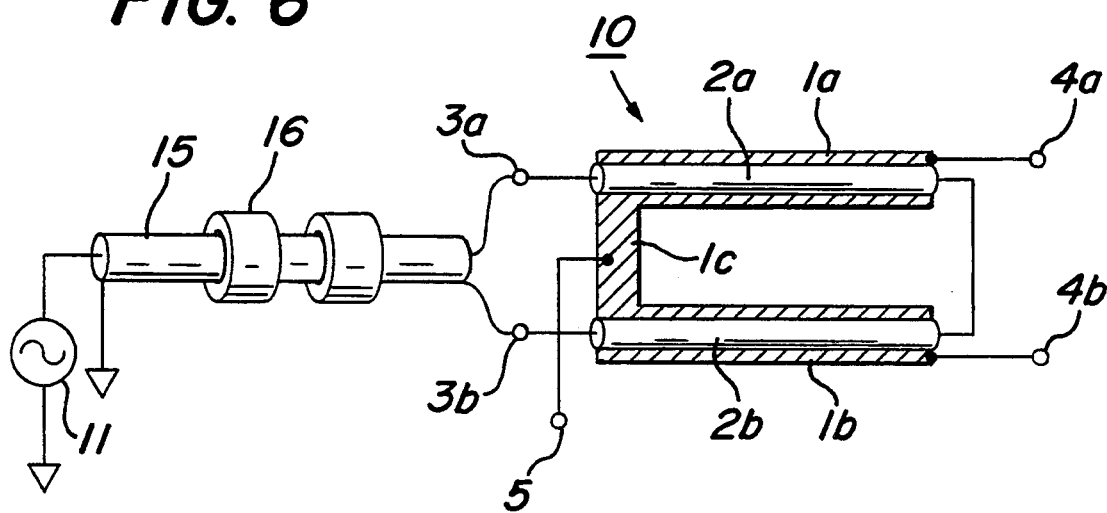
FIG. 6 shows an embodiment in which a common mode choke is connected to the local oscillator of the mixer.

FIG. 6 shows a DBM with a common mode choke 15 comprising a coaxial cable connected in between the local oscillator and the high frequency transformer. The common mode choke 15 is used, for example, when the current for switching the diodes $D_1$ and $D_2$ and the current for switching the diodes $D_3$ and $D_4$ are different because the local signal is provided with a common mode voltage due to a capacitance between the center conductors of the coaxial cables 1a and 1b and the ground. The provision of the choke 15 enables the matching between the switching currents of the diodes $D_1$ and $D_2$ and the diodes $D_3$ and $D_4$, and thus a highly-balanced IF output can be obtained.

Moreover, as shown in FIG. 6, a toroidal bead 16 may be installed on the common mode choke 15 to further increase the common mode inductance.

Figure 7:
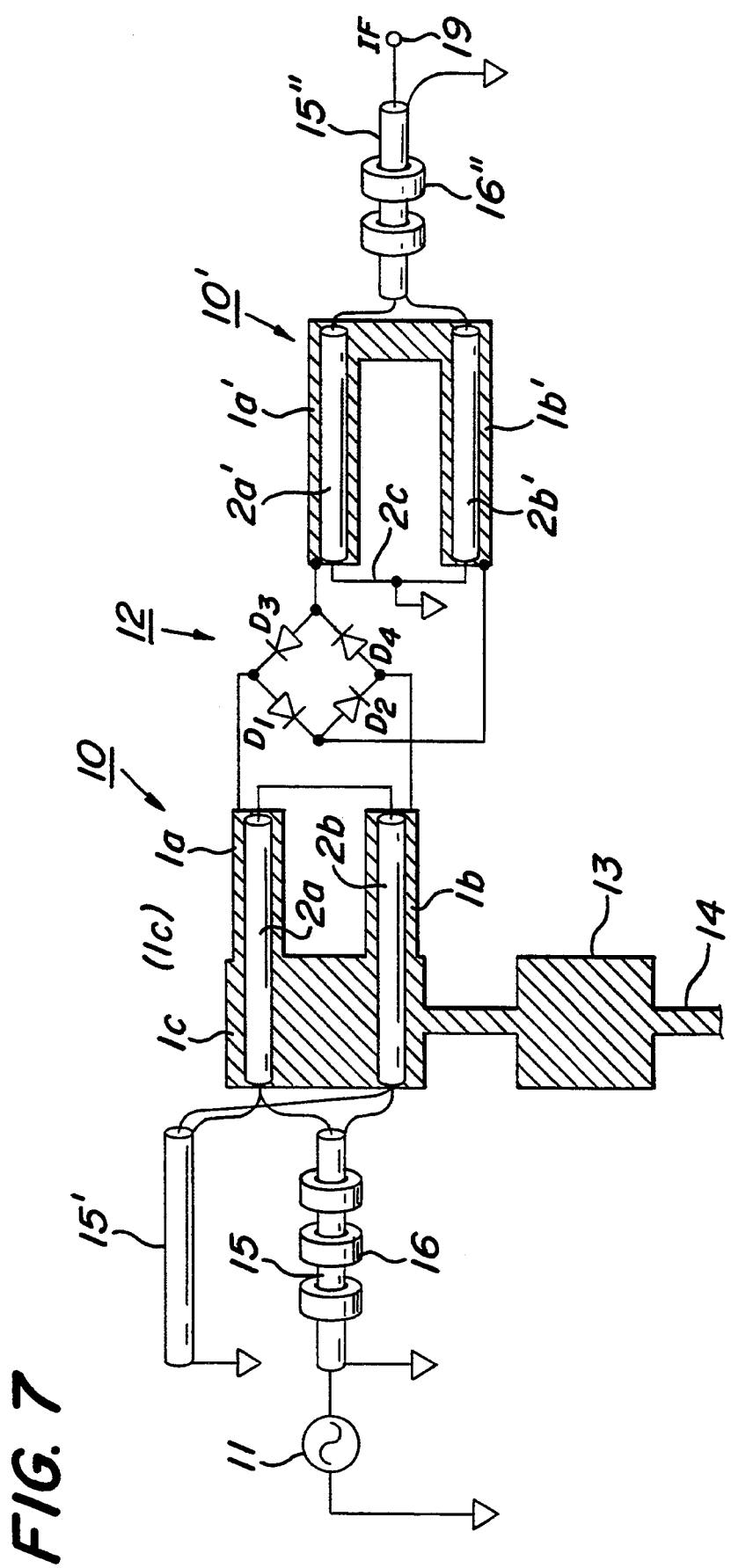
FIG. 7 is a circuit diagram of an embodiment in which the mixer of the present invention is used in a broader frequency band.

FIG. 7 shows an embodiment in which the mixer as described above is extensively used in a broader frequency band. A low-pass filter comprising the capacitor 13 and the inductance 14 as shown in FIG. 5 is formed at the RF input side and the capacitor 1c' formed on the short-circuiting pattern 1c. A dummy choke 15' which is substantially identical to the common mode choke 15 as shown in FIG. 6 is connected in parallel with the local oscillator 11. In this case, the center conductor of the coaxial cable 2b which is connected to the outer conductor of the common mode choke 15 is connected to a center conductor of the common mode choke 15', while the center conductor of the coaxial cable 2a which is connected to the center conductor of the common mode choke 15 is connected to an outer conductor of the common mode choke 15'. Thus a highly-balanced condition (symmetrical situation) at the local oscillator side can be maintained. In order to further improve the balanced condition to toroidal bead 16 can also be installed to the common mode choke 15'.

In addition, a transformer 10' having the same structure as the transformer shown in FIG. 3(A) is formed at the output side of the diode set 12. The output terminal of the diode set 12 is connected to the ends of the strip lines 1a' and 1b' of the transformer 10' which are located at the tip portion of the U-shaped pattern. The short-circuiting portion 2c at the ends of the coaxial cables 2a' and 2b' located at the tip portion of the U-shaped pattern are grounded.

The transformer 10' is used as a balanced-to-unbalanced transformer. The balanced-to-unbalanced conversion is carried out by reversing the phase of one of the two balanced outputs from the diode set 12.

Further, a common mode choke 15" similar to the common mode choke 15 is connected to the first port (in FIG. 7, a toroidal bead 16" is provided), and the IF signal is output from the output terminal of the common mode choke 15".

Figure 8:
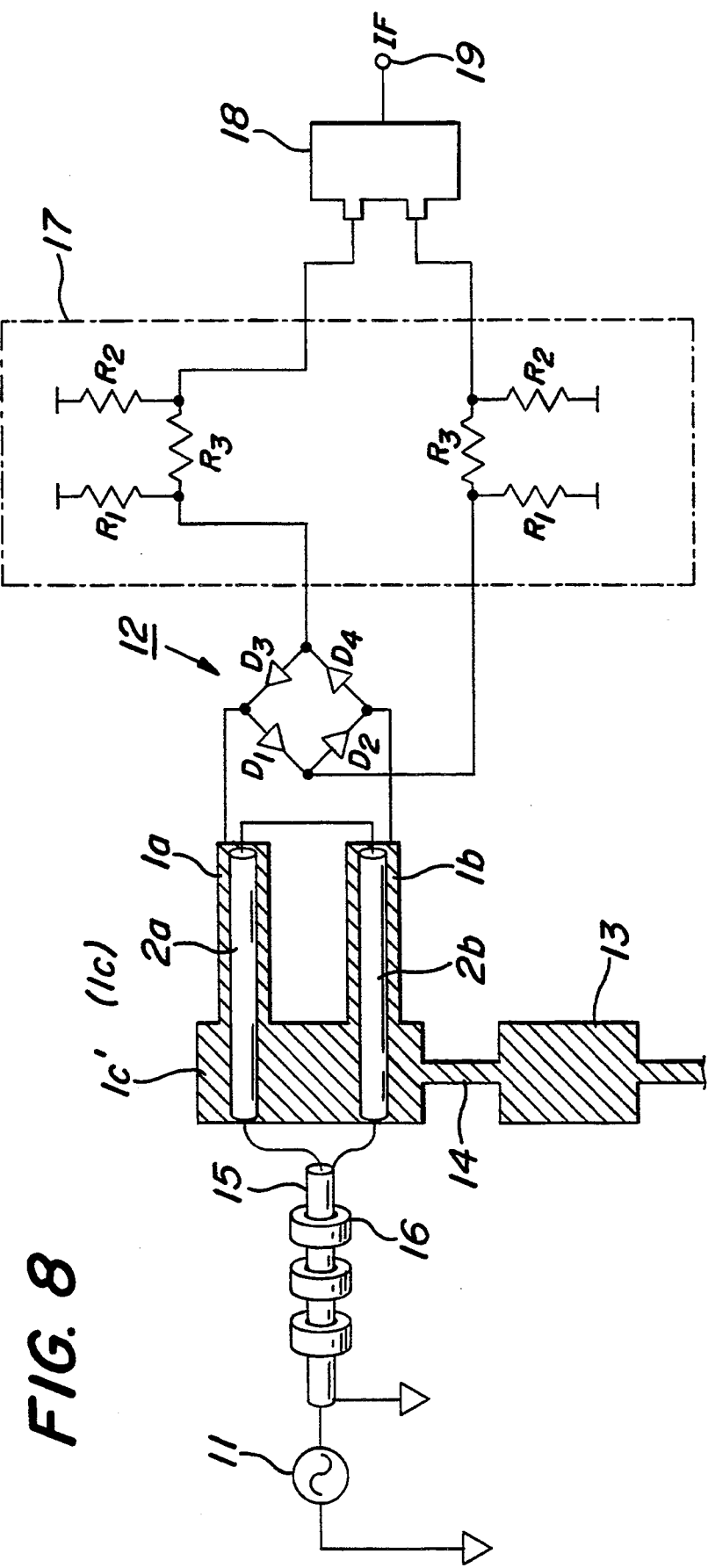
FIG. 8 is a circuit diagram of another embodiment in which the mixer of the present invention is used in a broader frequency band.

FIG. 8 is a circuit diagram of another embodiment in which the mixer shown in FIG. 6 is extensively used in the broader frequency band.

In FIG. 8, an attenuator 17 (comprising two sets of resistances $R_1$ to $R_3$) is connected to the output side of the diode set 12. One of the lines drawn from both output terminals of the diode set 12 is set to be longer than the other by a half of wavelength of a particular frequency (frequency after conversion) so that the attenuator 17 also serves as a balanced-to-unbalanced transformer.

Two balanced outputs from the diode set 12 are converted into unbalanced outputs by the balanced-to-unbalanced transforming action of the attenuator 17, and outputted from an IF terminal 19 through a pattern 18 to permit matching with a circuit at a next stage.

The high frequency transformer of this invention can be used not only in the DBM, but also in the SBM. When it is used in the SBM, one of the strip lines of the U-shaped pattern is used as a dummy.

In the high frequency transformer of this invention, lead wires are provided on the two strip lines of the U-shaped pattern such that they are insulated from the strip lines and both ends of the lead wires at the tip portions of the U-shaped pattern are short-circuited to each other. The length of the two strip lines is set to a suitable value, so that an ideal transformer usable in a wider frequency band can be attained. Further, if the short-circuiting pattern portion of the U-shaped pattern can be shaped in a desired form, the short-circuiting pattern portion can be also used as a capacitor pattern for a filter circuit.

Further, in the mixer according to this invention, the short-circuiting portion of the U-shaped pattern of the above transformer is used as the RF input terminal, the ends of the lead wires at the tip portions of the U-shaped pattern serve as the IF input terminal, and the local oscillator is connected between both terminals of the center conductors at the short-circuiting pattern side of the U-shaped pattern, which are electrically insulatedly provided on the two strip lines. Therefore, since the primary side of the high frequency transformer viewed from the local oscillator, the ends of the center conductors of the coaxial cables are short-circuited and are not grounded, the impedance at the local oscillator cannot be seen at the RF input terminal even when the common mode choke is coupled to the local oscillator.

While the invention has been described and illustrated with reference to specific embodiments, those skilled in the art will recognize that modification and variations may be made without departing from the principles of the invention as described hereinabove and set forth in the following claims.

What is claimed is:

1. A high frequency transformer comprising:
   two strip lines and a short-circuiting pattern coupled there between, each strip line having a first end connected to the short-circuiting pattern and each strip line having a second end extending away from the short-circuiting pattern;
   two lead wires insulatedly formed onto the strip lines so that one lead wire is formed on each respective strip line, each lead wire so formed having a first end proximate to the first end of the respective strip line and having a second end proximate to the second end of the respective strip line; and
   the second ends of the lead wires being short circuited together, the first ends of the lead wires serving as a first port and the second ends of the respective strip lines serving as a second port.

2. The transformer of claim 1, wherein the first port and the second port are operable to serve as an input terminal and an output terminal of the high frequency transformer, the transformer further comprising:
   a third port coupled to the short-circuiting pattern serving as one of a second input terminal and a second output terminal of the high frequency transformer.

3. The transformer of claim 1, wherein the short-circuiting pattern is formed into a capacitor.

4. The transformer of claim 1, wherein the two strip lines and the short-circuiting pattern form a U-shape pattern, wherein the strip lines form the sides of the U-shape pattern and the short-circuiting pattern forms the base of the U-shape.

5. The transformer of claim 1, wherein each lead wire and the respective strip line said lead wire is formed on have substantially equal lengths.

6. A mixer for converting a radio frequency input from a radio frequency input system to an intermediate frequency output, comprising:
   the high frequency transformer of claim 1;
   a local oscillator coupled to the first port of the high frequency transformer;

a switch means coupled to the second port serving as an intermediate frequency output terminal; and a third port coupled to the short-circuiting pattern serving as a radio frequency input terminal for providing the radio frequency input to the short-circuiting pattern and the two strip lines coupled thereto.

7. The mixer of claim 6, wherein a common mode choke is coupled between the first port of the high frequency transformer and the local oscillator, further comprising:

a dummy choke coupled to the first port in parallel with the local oscillator and having substantially identical characteristics with the common mode choke to further balance the mixer.

8. The mixer of claim 7, further comprising:

a second high frequency transformer as recited by claim 1, for providing a balanced-to-unbalanced conversion, the second port of the second high frequency transformer being coupled to an output terminal of the switch means and the first port of the second transformer serving as the intermediate frequency output terminal.

9. The mixer of claim 8, further comprising:

a second common mode choke coupled to the first port of the second transformer for serving as the intermediate frequency output terminal.

10. The mixer of claim 6, further comprising:

an attenuator coupled to the switch means for providing a balanced-to-unbalanced conversion.

11. The mixer of claim 6, wherein the switch means comprises a diode bridge circuit.

12. The mixer of claim 6, wherein a characteristic impedance of the strip lines is approximately twice as large as a characteristic impedance of the radio frequency input system.

13. A mixer for converting an output from a first frequency to an output at a second frequency, comprising:

(a) a high frequency transformer comprising:

two strip lines and a short-circuiting pattern coupled there between, each strip line having a first end connected to the short-circuiting pattern and each strip line having a second end extending away from the short-circuiting pattern;

two lead wires insulatedly formed onto the strip lines so that one lead wire is formed on each respective strip line, each lead wire so formed having a first end proximate to the first end of the respective strip line and having a second end proximate to the second end of the respective strip line;

the second ends of the lead wires being short circuited together, the first ends of the lead wires serving as a first port and the second ends of the respective strip lines serving as a second port;

(b) a local oscillator coupled to the first port of the high frequency transformer;

(c) a switch means coupled to the second port serving as one of an intermediate frequency output terminal and a radio :frequency input terminal; and (d) a third port coupled to the short-circuiting pattern serving as the intermediate frequency output terminal where the second port is serving as the radio frequency terminal or serving as the radio frequency input terminal where the second port is serving as the intermediate frequency output terminal.

* * * * *

UNITED STATES PATENT AND TRADEMARK OFFICE
CERTIFICATE OF CORRECTION

PATENT NO. : 5,369,795
DATED : November 29, 1994
INVENTOR(S) : Toshiyuki YANAGIMOTO It is certified that error appears in the above-indentified patent and that said Letters Patent is hereby corrected as shown below:

At column 8, line 30, delete "there between" and insert --therebetween--.

At column 10, line 8, delete "there between" and insert --therebetween--.

At column 10, line 27, delete ":frequency" and insert --frequency--.

Signed and Sealed this

Second Day of July, 1996

Attest:

BRUCE LEHMAN

Attesting Officer    Commissioner of Patents and Trademarks